(12) United States Patent
Sugimoto et al.

(10) Patent No.: US 7,122,894 B2
(45) Date of Patent: Oct. 17, 2006

(54) WIRING SUBSTRATE AND PROCESS FOR MANUFACTURING THE SAME

(75) Inventors: Atsuhiko Sugimoto, Aichi (JP); Hajime Saiki, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 11/071,203

(22) Filed: Mar. 4, 2005

(65) Prior Publication Data

US 2005/0253263 A1  Nov. 17, 2005

(30) Foreign Application Priority Data

Mar. 5, 2004  (JP) .............................. 2004-063022

(51) Int. Cl.
*H01L 23/48* (2006.01)

(52) U.S. Cl. ..................... 257/737; 257/738; 257/772; 257/779; 257/E23.023

(58) Field of Classification Search ................ 257/737, 257/738, 779, 780, 781, 762, 772
See application file for complete search history.

(56) References Cited

U.S. PATENT DOCUMENTS

| | | | |
|---|---|---|---|
| 5,985,212 A | * | 11/1999 | Hwang et al. .............. 420/560 |
| 6,358,630 B1 | * | 3/2002 | Tsukada et al. ............. 428/646 |
| 2002/0189849 A1 | * | 12/2002 | Hirose et al. ................ 174/250 |

OTHER PUBLICATIONS

Masayoshi Date, et al., "Evaluation of Lead-Free Solder Balls Produced by Uniform Droplet Spray Method", Hitachi Metals Technical Report, vol. 18, 2002, pp. 43-48.

Hisaaki Takao, et al., "Development of Highly Reliable Sn-Ag Lead-Free Solder Alloy", Toyota Central R & D Labs, R & D Review, vol. 35, No. 2, 2002, pp. 39-46, Abstract.

* cited by examiner

*Primary Examiner*—Minh-Loan Tran
(74) *Attorney, Agent, or Firm*—Sughrue Mion, PLLC

(57) ABSTRACT

A wiring substrate incorporating nickel-plated copper terminal pads for solder bumps, wherein a nickel plating layer constituting the nickel plated copper terminal pads has a phosphorus content of 8.5 to 15.0% by mass and is covered with a gold plating layer.

9 Claims, 5 Drawing Sheets

Solder Bump

Nickel Plating Layer

Solder Bump

Phosphorous Rich Layer

Nickel Plating Layer

WIRING SUBSTRATE AND PROCESS FOR MANUFACTURING THE SAME

BACKGROUND OF THE INVENTION

1. Field of the Invention

This invention relates to a wiring substrate, particularly to a wiring substrate including terminal pads for bonding solder bumps, and a process for manufacturing the wiring substrate.

2. Description of the Related Art

The following is a list of the related art:

Patent Literature 1—Japanese Patent Office Official Gazette JP-A-2002-4098;

Non-Patent Literature 1—Hitachi Metals Technical Report: "Evaluation of Lead-Free Solder Balls Produced by Uniform Droplet Spray Method", vol. 18 (2002), page 43;

Non-Patent Literature 2—Toyota Central R & D Labs. R & D Review: "Development of Highly Reliable Sn—Ag Lead-Free Solder Alloy", vol. 35, No. 2 (2000), page 39.

A package used for enclosing and connecting an IC or LSI chip therein has a type of wiring substrate comprising a wiring laminate formed by laminating dielectric insulating layers made of a high-molecular polymer or ceramic and inner wiring metal conductors so that the inner wiring conductors are sandwiched and insulated from each other by the dielectric layers. Metal terminal pads are disposed on an outer surface of the wiring substrate so as connect with an IC-flip chip or a motherboard by soldering in a ball-grid array (BGA) or pin-grid array (PGA) formation. Most of these terminal pads are connected to the inner wiring conductors through via-conductors penetrating at least one of dielectric layers. The inner wiring conductors and via-conductors are normally formed from metal having good electrical conductivity such as copper, and the metal terminal pads also comprise such metal.

The terminal pads formed from copper are plated with nickel and further plated with gold so as to prevent oxidation of copper and to improve their bonding and wetting with solder bumps to be formed thereon for contacting the IC chip or motherboard.

An electroless-nickel plating bath that is conventionally employed for plating nickel for the terminal pads contains a phosphoric acid compound such as sodium hypophosphite as a reducing agent and further necessarily contains phosphorus so that a nickel plating layer resultantly formed by electroless-nickel plating contains as much as 4 to 8% by mass of phosphorus. When solder that is placed on the terminal pad melts, an outermost gold plating layer diffuses and is incorporated into the solder, such that the underlying electroless nickel plating layer contacts the solder.

Relating to this, it is conventionally known that when the electroless-nickel plating layer contains P (phosphorus), a brittle phosphorus-rich nickel layer is formed at an interface between a lead-free solder and the electroless-nickel plating layer, as disclosed in Non-Patent Literature 1. Further, it is conventionally known from Non-Patent Literature 2 that P lowers flowability of the lead-free solder comprising mainly tin and decreases the bonding strength of the solder with the nickel plating layer.

It has often been pointed out that the strength of a solder joint formed on an electroless-nickel plating layer containing phosphorus is lowered due to boundary separation when a wiring substrate having such a solder joint is distorted or is subject to shock such as a dropping impact. Since a Ni—Sn alloy layer is formed by reaction of Ni (nickel) in the plating layer and Sn (tin) of the solder, the solder is likely to lose ductility, possibly reducing its bonding strength.

Moreover, a problem of environmental pollution has recently prompted a need for replacing Sn—Pb eutectic solders by Pb-free solders not containing harmful lead. Pb-free solders are mainly composed of tin (Sn) and they are eutectic solders containing auxiliary constituents such as silver, copper, zinc, and bismuth, and not containing Pb (lead). Although solders that contain a small amount of Pb are available today, their auxiliary constituents other than Sn are mainly those selected from the elements mentioned above. The lead-free solder is inferior in ductility, compared to the Sn—Pb eutectic solder, and is more likely to form a solder joint having a problem such as boundary separation.

As reported in Non-Patent Literature 1, it is considered that formation of the phosphorus-rich layer is a direct cause of boundary separation of the solder joint. In fact, the boundary separation of any solder joint is remarkably suppressed by employing phosphorus-free nickel plating such as Ni (nickel)—B (boron) electroless-plating or nickel-electroplating that does not rely on phosphorus.

In a process of electroplating nickel for the terminal pads, however, it is necessary to form a very complicated pattern for tie bars that are to be electrically connected to the terminal pads formed on a pad-forming area of the wiring substrate. This electroplating process makes it difficult to reduce the distance between the terminal pads beyond a certain extent, as it is necessary to ensure space for the insertion of tie bars between the terminal pads. Consequently, the, pad forming area is increased, causing additional design restrictions.

The Ni—B electroless-nickel plating also presents a problem. Since it employs a hydrogenated boron compound as a reducing agent, the Ni—B electroless nickel plating generates, during a reducing reaction for nickel deposition, a large amount of hydrogen gas. The hydrogen gas is easily incorporated into an electroless nickel plating layer, resulting in defects such as foaming and swelling of the nickel plating layer.

SUMMARY OF THE INVENTION

It is, therefore, a first object of the present invention to provide a reliable wiring substrate incorporating nickel-plated terminal pads for forming lead-solder bumps thereon, wherein a nickel-plating layer constituting the nickel-plated terminal pad is formed by electroless plating, contains phosphorous, and which provides improved bonding strength with the solder bumps.

A second object of the invention is to provide a process for manufacturing a wiring substrate incorporating terminal pads that are nickel-plated by electroless-nickel plating, such that nickel-plating layers constituting the terminal pads formed by the electroless-nickel plating highly resist a decrease in bonding strength of solder bumps to be formed on the terminal pads.

The above first object of the invention has been achieved by providing a wiring substrate, comprising:

a laminate of dielectric insulating layers and inner wiring conductors each comprising a copper layer;

via-conductors connecting the inner wiring conductors;

nickel-plated terminal pads disposed on the wiring substrate and connecting to the inner wiring conductors; and a gold-plating layer formed on each of the nickel-plated terminal pads;

wherein the nickel-plated terminal pads comprise an electroless-nickel plating layer containing 8.5% to 15% by mass of phosphorus.

The gold plating layer has a thickness of about 0.03 to 0.1 μm and is preferably formed by electroless-displacement plating. An underlying layer just below the nickel-plating layer constituting the nickel-plated terminal pad comprises copper.

An advantage of this wiring substrate is that since the electroless-nickel plating layer constituting the nickel plated-terminal pad contains phosphorus in an amount of at least 8.5% up to 15% by mass, improved boding strength of solder bumps bonded to the terminal pads is realized. Particularly, boundary separation at an interface between the nickel-plated terminal pad and the solder bump soldered thereon is greatly suppressed when the solder bump made of lead-free solder alloy comprising mainly tin is soldered to the electroless-nickel plating layer of the terminal pad.

The wiring substrate according to the invention may further comprise solder bumps bonded to the nickel-plated terminal pads, the solder bumps comprising a lead-free alloy having a melting point of higher than 200° C.

The above second object of the invention has been achieved by providing a process for manufacturing a wiring substrate, comprising:

forming a terminal pad comprising copper on a surface of a wiring substrate;

forming a nickel layer containing from 8.5 to 15% by weight of phosphorus on the terminal pad by electroless-nickel plating; and further forming a gold plating layer on the nickel plating layer by electroless-displacement plating in a thickness of 0.03 to 0.1 μm.

In a preferred embodiment of the invention, the process may further comprise placing a lead free-solder ball containing tin on the gold plating layer; and melting the lead free-solder ball at a temperature of higher than 200° C. so as to form a lead-free solder bump on the nickel plating layer constituting the terminal pad and to diffuse the gold plating layer into the solder bump.

A characteristic feature of the invention lies in that a nickel-plating layer formed by electroless-plating for nickel-plated terminal pads incorporated in a wiring substrate contains phosphorus in an amount greater than the conventional amount (i.e., the conventional amount being 4 to 8% by mass), whereby improved bonding strength of lead-free solder bumps to the terminal pads incorporated in the wiring substrate is reliably attained.

The amount of phosphorus contained in the nickel plating layer of the terminal pad formed in the wiring substrate is at least 8.5% up to 15% by mass (or rather by weight), and more preferably in an amount of 9 to 10% by mass, according to the invention.

As described above, because electroless-nickel plating layers formed for the metal terminal pad of a wiring substrate conventionally have had a phosphorus content of 4 to 8% by mass, formation of a brittle phosphorus-rich nickel layer at an interface between the solder and the nickel plating layer has been considered to be a principal cause of boundary separation at the interface. Accordingly, one of ordinary skill in the art would naturally consider or would be lead to reduce or minimize the phosphorus content in any electroless-nickel plating layer so as to restrain or suppress formation of the brittle phosphorus-rich layer.

The present inventors have conceived of an entirely different approach contrary to conventional wisdom in the use of an electroless-nickel plating layer having a phosphorus content of more than 8% by mass. As an unexpected advantageous result, the present inventors found that the occurrence of boundary separation at the interface between the nickel-plating layer and the Pb-solder bump is greatly reduced, when an electroless-nickel plating layer containing 8.5% or more by mass of phosphorus is formed as a terminal pad of the wiring substrate.

As reported by the related art, the brittle phosphorus-rich layer appears at a boundary interface between the electroless nickel plating layer and the Pb-free solder bump comprising Sn soldered to a nickel-plated copper pad when an electroless nickel plating layer containing 8% or less by weight of phosphorus is used. Surprisingly, on the other hand, the phosphorus-rich layer disappears when the same lead-free solder bump comprising Sn is soldered to the nickel-plated copper pad comprising the electroless nickel plating layer containing phosphorus in an amount of about 8.5% up to 15% by weight. Notably, the thin gold plating layer having a thickness of 0.03 to 0.1 μm plated on the nickel plating layer also disappears, diffusing into the solder ball during soldering.

This invention solves a problem in the prior art caused by formation of the phosphorus-rich layer that lowers peeling strength of the lead-free solder bump at its soldering interface with the electroless nickel plating layer containing phosphorus. In other words, a solder strength criterion of nickel-plated copper pads incorporated in a wiring substrate is advantageously and highly increased by incorporating phosphorus in an amount of at least 8.5% by mass up to 15% by mass in the nickel plating layer constituting the terminal pad, resultantly contributing to mass-production of reliable wiring substrates, according to the invention.

A phosphorus content of less than 8% by mass hardly improves the bonding strength of a solder bump to the nickel plated terminal pad. A phosphorus content exceeding 15.0% by mass is likely to result in an unstable plating bath which can hardly form a stable nickel plating layer for the nickel-plated terminal pad. The electroless-nickel plating layer, more preferably, has a phosphorus content of 9.0 to 10.0% by mass. Notably, the phosphorus content of the electroless-nickel plating layer can be adjusted by altering the amount of phosphoric acid compound (e.g. sodium hyposulfite or pyrophosphate) added as a reducing agent to the electroless nickel plating bath.

The thin gold plating layer formed on the nickel-plated copper is particularly effective when the gold plating layer is formed by displacement type electroless-gold plating so as to displace a surface of the nickel plating layer with gold. The electroless-gold plating can be carried out by using potassium boron hydride or dimethylamineborane as a reducing agent and having a plating metal (gold) deposited by a displacement reaction with a base metal (nickel) to be plated at least during the initial stage of reaction. The progress of the displacement reaction requires dissolution of the base metal, i.e., nickel, which takes place when a plating bath liquid contacts the exposed portion of the base metal not covered with the plating metal.

At this time, a thin oxide film is formed on the surface of the base metal upon contact with the plating liquid as shown in FIG. 5, and as disclosed in patent literature 1. The plating metal deposited around the oxide film grows over the oxide film that remains between the base metal and the plating layer formed thereon. This thin oxide film is considered to block diffusion of phosphorus molecules toward the solder thereby forming a brittle phosphorus-rich nickel layer at the time of soldering.

The thin oxide film thus formed is broken and diffused into the solder bump when phosphorus diffusion exceeds a certain level during soldering. Since the content of phosphorus contained in the nickel layer according to the invention is higher than that of a conventional nickel layer, abundant phosphorus molecules may more easily push the oxide film towards the melting solder when the gold plating layer melts and diffuses into the solder, bump. Consequently, the phosphorus molecules are no longer blocked or held at the oxide film forming a phosphorus-rich nickel layer.

In other words, since less of a brittle phosphorus-rich nickel layer is formed, more consistent soldering reaction occurs at the soldering interface of the nickel plating layer and the solder. This in turn forms a more uniform alloy layer of nickel and solder and improves the bonding strength of the lead-free solder to the nickel-plated terminal pad, when the phosphorus content in the electroless-nickel plating layer is 8.5% or more and up to 15% by weight, according to the invention.

A recent tendency from the standpoint of environmental protection has been to reduce to the extent possible the amount of Pb (lead) in the solder. A conventional Sn—Pb eutectic solder contains 38% by mass of lead and has a melting point of 183° C. Tin has a melting point of 232° C. that is almost 50° C. higher than that of the PB—Sn eutectic solder, and it is difficult to use tin as a substitute for Pb—Sn solder. In another aspect of the invention, therefore, the present inventors have explored lead-free solder alloys containing tin and eutectic constituents other than lead, suitable for the terminal pad. The requirements for a lead-free solder alloy for the solder bump must include a low melting point, low cost, good solderability, good flowability, and high corrosion resistance.

An unexpectedly limited variety of auxiliary eutectic constituents to be added to tin satisfies all of these requirements and only several elements such as Zn, Bi, Ag and Cu are found acceptable as the auxiliary constituents. A Sn—Zn alloy has an eutectic point when it has a zinc content of about 15% by mass and the alloy having such zinc content has a melting point of as low as about 195° C. However, Zn (zinc) is so low in corrosion resistance that its content is limited to a range of about 7 to 10% by mass, and any binary alloy having such a zinc content has a melting point as high as about 215° C. Bi (bismuth) in the amount of 1 to 5% by mass is further added to lower its melting point, but it is difficult to obtain a melting point lower than 200° C. Moreover, bismuth is expensive and its steady supply is unreliable.

While silver and copper themselves have far higher melting points than tin, both Sn—Ag and Sn—Cu alloys have eutectic points when they are tin-rich alloys having a silver content in the vicinity of 5% by mass or a copper content in the vicinity of 2% by mass. Both of the Sn—Ag and Sn—Cu binary alloys, however, have eutectic points in the neighborhood of 220° C. and the ternary alloy has a melting point of about 200° C.

For achieving a low melting point alloy for the terminal pads according to the invention, a Sn—Ag alloy desirably has a silver content of 3 to 6% by mass, a Sn—Cu alloy desirably has a copper content of 1 to 3% by mass, and a Sn—Ag—Cu alloy desirably has a total silver and copper content of 3 to 6% by mass and a Cu/(Ag+Cu) ratio by mass in the range of 0.1 to 0.5.

As seen from the foregoing, a lead-free tin alloy having a far lower lead content than a Sn—Pb eutectic solder almost inevitably has a high melting point exceeding 200° C. (though it is lower than the melting point of tin itself, 232° C.).

The high soldering temperature of the lead-free solder comprising tin has been considered disadvantageous from the standpoint of solder bonding strength, since there is a tendency to promote formation of a less ductile compound of tin and nickel.

According to this invention, since reduction in solder bonding strength is not worrisome, particularly boundary separation caused by the brittle phosphorus-rich nickel layer formed at the bonding interface, a wider allowance in reduction of the solder bonding strength caused by other factors (such as formation of an inductile compound of tin and nickel at a comparatively high temperature) can be tolerated.

As a result, a highly reliable solder joint structure for the wiring substrate incorporating a large area of nickel-plated terminal pads, which area is often called as a BGA (ball grid array) or PGA (pin grid array), to be soldered to the flip chip or the motherboard by lead-free solder bumps containing tin, is advantageously attained.

DESCRIPTION OF THE PREFERRED EMBODIMENTS

Preferred embodiments of this invention will now be described with reference to the drawings. However, the present invention should not be construed as being limited thereto.

Figure 3:
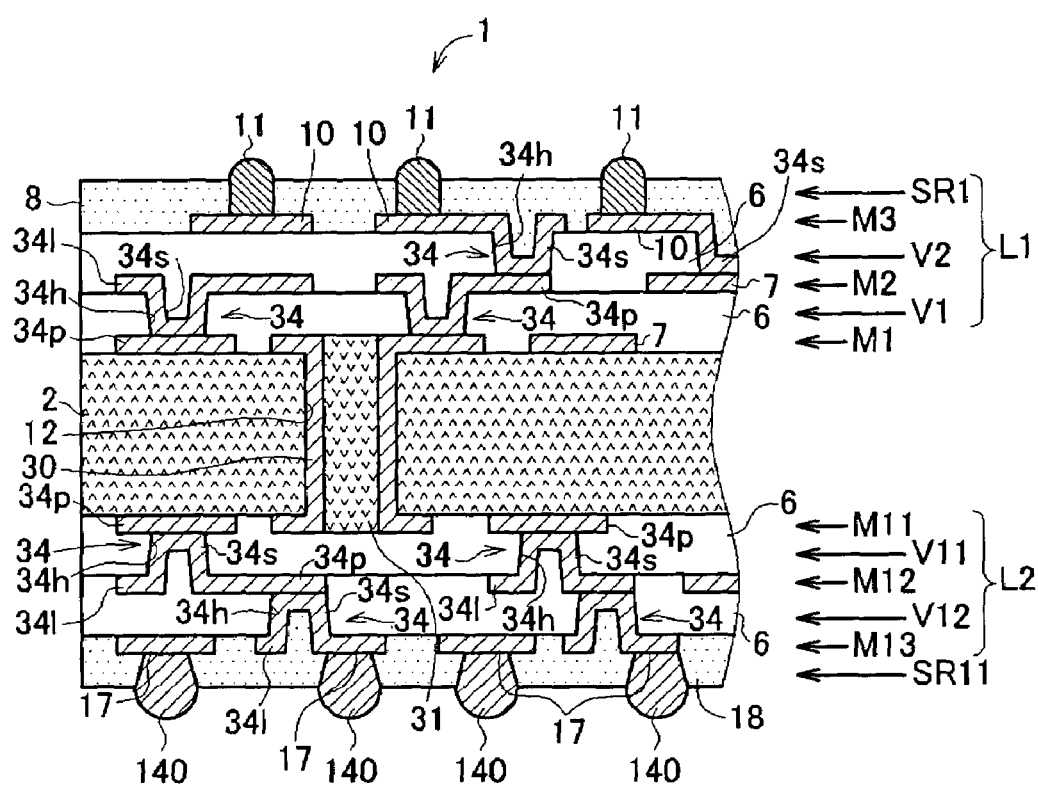
FIG. 3 is a sectional view of the wiring substrate 1 of FIG. 1, showing inner wiring conductors 34, terminal pads 10, 17 connecting the inner conductors 34, and solder bumps 11, 140 formed on the terminal pads.

FIG. 3 schematically shows a sectional construction of a wiring substrate 1 embodying this invention. The wiring substrate 1 has a pair of core-conductor forming layers (M1, M11) each formed on opposite surfaces of a sheet core 2 having a thickness of about 800 μm made of, e.g., a heat-resistant resin sheet (e.g. a bismaleimide-triazine resin sheet) or a fiber-reinforced resin sheet (e.g. a glass fiber-reinforced epoxy resin), and each forming inner wiring conductors 7 in a predetermined pattern. The core-conductor forming layers (M1, M11) cover substantially the entire surfaces of the sheet core 2 and are used as a power source layer or ground layer. The sheet core 2 has a through-hole 12 therein and has a through-hole conductor 30 formed on its inner wall surface for connecting the core-conductor forming layers (M1, M11). The through-hole 12 is filled with a plugging resin 31 such as an epoxy resin.

First, insulating dielectric buildup layers (V1, V2) made of a dielectric resin layer 6 through which via-holes 34 penetrate are formed on the core-conductor forming layer (M1, M11), respectively. First-conductor forming layers (M2, M12) each having a metal wiring conductor 7 formed by plating copper are formed respectively on the first-via forming layers (V1, V11). The via-holes 34 are formed for connecting the inner conductors of the core-conductor forming layer (M1, M11) with the inner conductors of the first conductor forming layers (M2, M12). Second insulating dielectric buildup layers (V2, V12) made from the photosensitive resin 6 through which the via-holes 34 penetrate are formed respectively on the first conductor forming layer layers (M2, M12). Terminal pads 10 and 17 are respectively formed on the second buildup layers (V2, V12). The terminal pads 10,17 are connected respectively to the first conductor forming layers (M2, M12) and may be connected if necessary to the second conductor forming layers (M3, M13) by the via-holes 34 in a different connection route. Each via-hole 34 has a via-conductor 34s formed on its inner wall surface 34h, a via-pad 34p connected to the via-conductor 34s, and a via-pad 34I extending from an open edge of the via-conductor 34s.

The core-conductor forming layer M1, first-via forming layer (V1), first-conductor forming layer (M2) and second-via forming layer (V2) form a first wiring laminate (L1) on a front side of the sheet core 2. The core-conductor forming layer (M11), first-via forming layer (V11), first-conductor forming layer (M12) and second-via forming layer V12 form a second wiring laminate (L2) on the rear side of the sheet core 2. These first and second wiring laminates (L1, L2) are formed by the alternate lamination of dielectric layers and inner wiring conductors so that the inner wiring conductors are sandwiched and insulated by the dielectric layers. The wiring laminates (L1, L2) incorporated in the wiring substrate 1 have a plurality of metal terminal pads 10 or 17 formed on their principal surfaces remote from the sheet core 2. The metal terminal pads 10 formed on the first wiring laminate L1 form solder pads for use in connecting to a flip chip comprising an IC integrated circuit. The metal terminal pads 17 formed on the second wiring laminate L2 form solder pads for use in connecting to a motherboard in a pin grid array (PGA) or ball grid array (BGA) connection.

Figure 1:
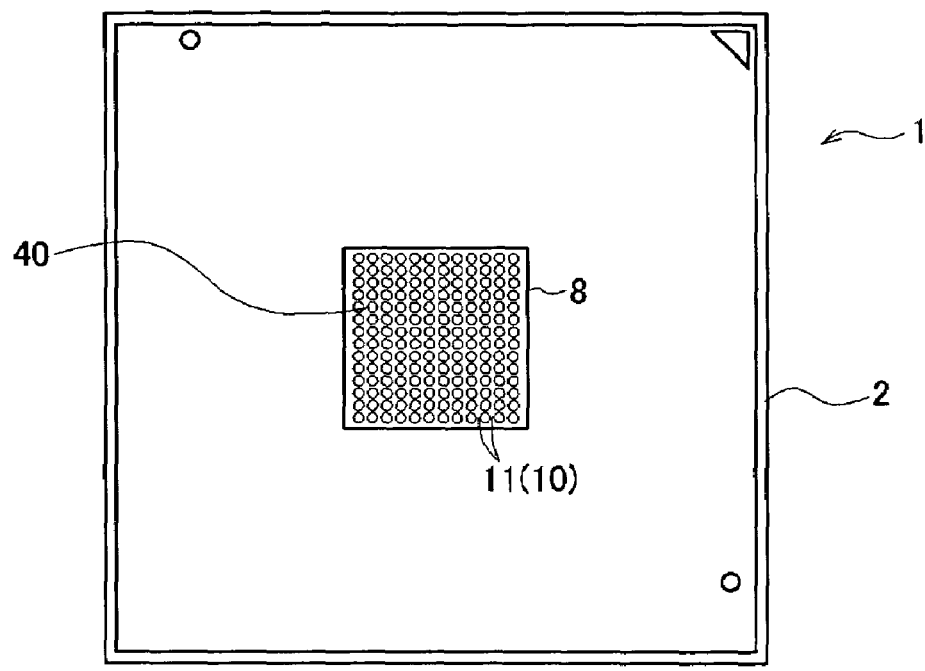
FIG. 1 is a top plan view of a wiring substrate 1 according to the invention, showing ball-grid arrayed terminal pads for connecting to an IC flip.
Figure 2:
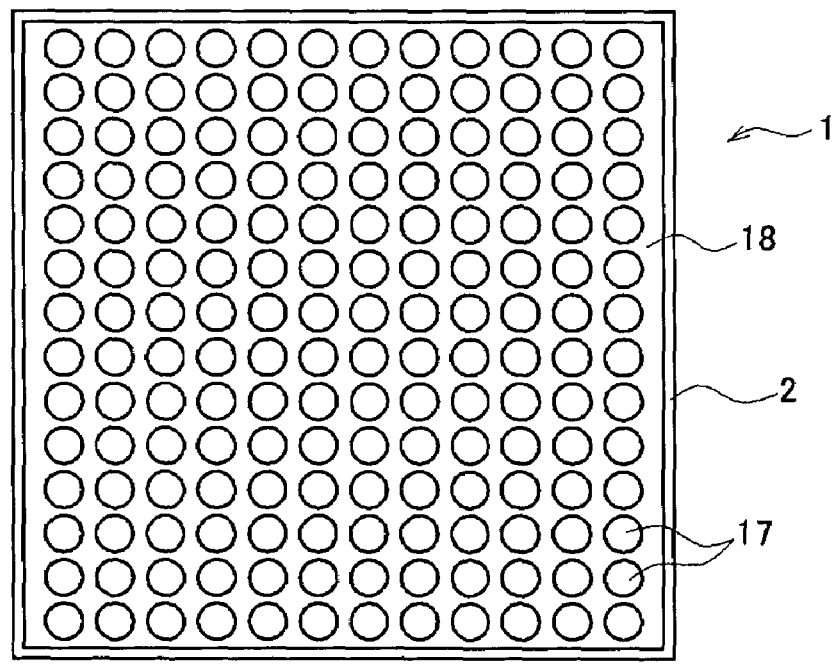
FIG. 2 is a bottom plan view of the wiring substrate of FIG. 1, showing ball-grid arrayed terminal pads for connecting to a motherboard.

The pads 10 formed in the second conductor forming laminate (M3) in the first wiring laminate (L1) are arranged in a grid pattern and substantially in the center of the front side of the wiring substrate 1 forming an IC chip mounting area 40 (as shown in FIG. 1) with solder bumps 11 formed thereon (as shown in FIG. 3). The pads 17 formed in the second conductor forming layer (M13) in the second wiring laminate (L2) are also arranged in a grid pattern as shown in FIG. 2. Solder resist layer are formed respectively on the second conductor forming layer (M3, M13) by using a dielectric resin layer 8, 18.

Figure 4A:
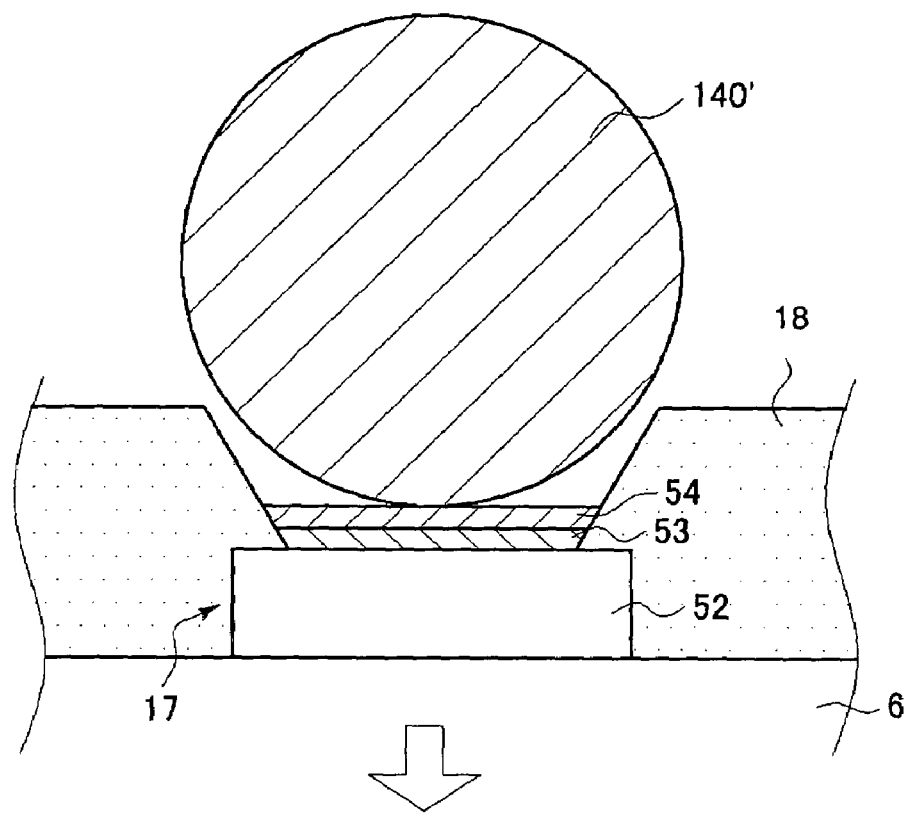
FIG. 4A is a schematic sectional view of terminal pad 17 shown in FIG. 3, showing the terminal pad comprising a copper layer 52 and a nickel plating layer 53, and a solder ball 140' placed on the terminal pad 17.

FIG. 4A shows a specific and typical structure of a terminal pad formed on a wiring substrate according to the invention, on which a solder ball 140' is placed to be soldered. A terminal pad 17 has a base layer 52 made of copper (Cu) having a thickness of 10 to 20 µm that is formed on a dielectric resin layer 6 by copper plating and partially covered by another dielectric resin 18 so as to form a recess for accommodating the solder ball 140'. A circular area of the copper base layer 52 not covered by the dielectric resin 18 is plated with nickel by electroless nickel plating so as to form a nickel plating layer 53 having a thickness of 3 to 10 µm on the copper base layer 52. A thin gold layer 54 having a thickness of 0.03 to 0.1 µm is plated on the nickel plating layer 53 by electroless displacement plating, i.e., chemically displacing a nickel surface by gold.

A material of the solder ball 140' is a lead-free alloy having a melting point of at least 200° C., such as Sn—Ag—Cu alloy (containing, for example, 3% by mass of Ag and 0.5% by mass of Cu), Sn—Cu alloy (containing, for example, 2% by mass of Cu), Sn—Zn alloy (containing, for example, 10% by mass of Zn), or Sn—Zn—Bi alloy (containing, for example, 8% by mass of Zn and 3% by mass of Bi).

Figure 4B:
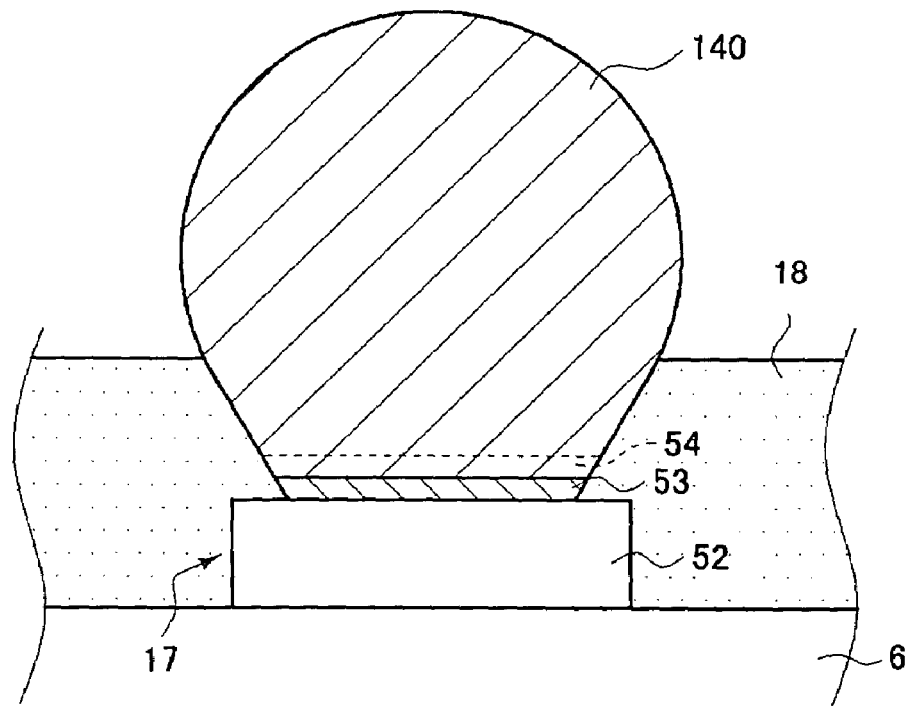
FIG. 4B is a schematic sectional view of terminal pad 17 shown in FIG. 3, showing the terminal pad comprising a copper layer 52 and a nickel plating layer 53 and a solder bump 140 soldered with the terminal pad 17.
Figure 5:
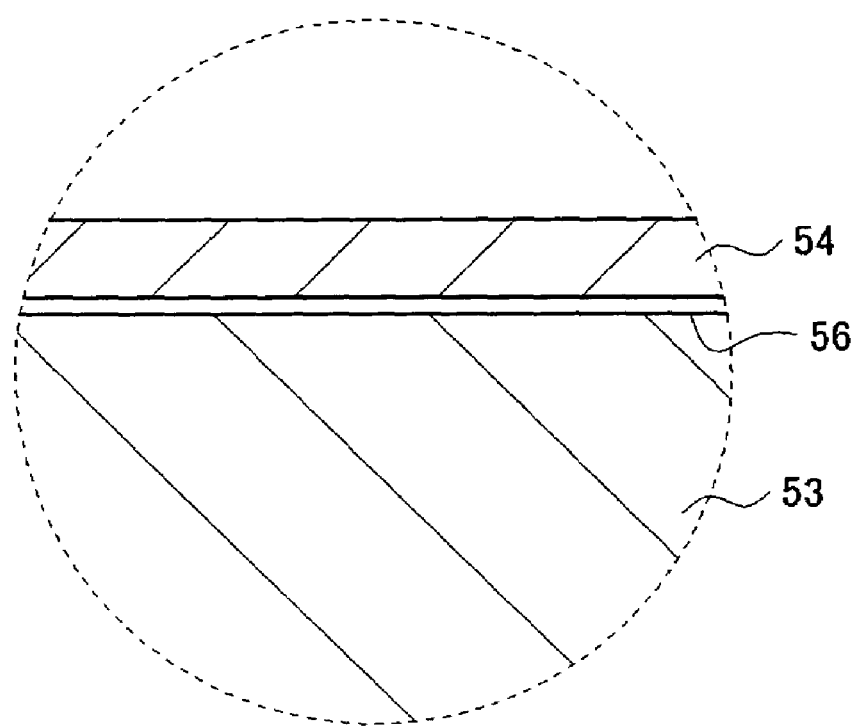
FIG. 5 is a schematic sectional view of an interface between a nickel plating layer 53 and a gold plating layer, showing an oxide film layer 56 formed therebetween during electroless gold plating on the nickel plating layer.

The solder ball 140 is melted by heating above the melting point thereof and soldered to the terminal pad 17, forming a solder bump 140 on the recess, as shown in FIG. 4B. In this soldering operation, the outermost gold plating layer 54 melts with the solder ball 140', completely diffusing or rather dissolving into the solder bump 140, so that the solder bump 140 directly contacts the underlying electroless-nickel plating layer 53.

The nickel plating layer 53 contains nickel and 8.5 to 15% by mass of phosphorus, according to the invention. The nickel plating layer 53 is formed by an electroless-nickel plating method using a plating bath that contains nickel sulfate as a plating metal source and a phosphoric acid compound, such as sodium hypophosphite or pyrophosphate, as a reducing agent. It is desirable to use an acidic plating bath containing a large amount of a phosphoric acid compound in order to satisfactorily form the nickel plating layer 53 having a high phosphorus content as required by the present invention. The following is a specific example of the bath composition:

Nickel sulfate—21 g/liter
Lactic acid—28 g/liter
Propionic acid—28 g/liter
Sodium hypophosphite—21 g/liter The gold plating layer 54 shown in FIG. 4A is a displacement plating layer formed by displacing the surface portion of the electroless-nickel plating layer 53. The displacement plating is carried out with an electroless method using potassium boron hydride or dimethylamineborane as a reducing agent and a monovalent or trivalent cyano-gold complex as a plating metal source. The following is an example of the bath composition:

Potassium dicyanoaurate (I)—5.8 g/liter
Potassium dicyanide—13 g/liter
Potassium hydroxide—11.3 g/liter
Potassium boron hydride—21.6 g/liter The following test was conducted to confirm that terminal pads according to the invention formed in the wiring substrate have improved bonding strength, and exert a high soldering strength with the solder bumps formed on the terminal pads.

Totally 100 samples of rectangular substrates 1, each having 1600 terminal pads 17 arranged in a ball grid array having an array pitch of 900 µm were prepared for the test. Notably, a method for manufacturing the substrate as described, e.g., in U.S. Pat. No. 6,719,185 B2, incorporated herein by reference, is generally applicable for making the substrate 1, except as described herein. Referring to FIG. 4, an average dimension of each terminal pad 17 adopted in this test was: about 15 μm in thickness for the copper conductors 52 plated on dielectric resin layer 6, about 7 μm in thickness for nickel plating layer 53 plated on the copper conductor by electroless plating, and about 0.05 μm in thickness for gold plating layer 54 plated on the nickel plating layer by electroless displacement. The diameter of a circularly exposed area of the terminal pad was about 450 μm and a depth of the recess on which a solder ball is placed was about 20 μm.

The test samples thus prepared were classified into 5 kinds (i.e., 20 samples for each kind), based on the phosphorous amount contained in the nickel plating layer constituting the terminal pads. The test samples included a first kind containing about 6% by weight of phosphorus within the conventional range, a second kind containing about 8.5% by mass of phosphorous, a third kind containing about 10% by mass of phosphorus, a fourth kind containing about 13% by mass of phosphorus, and a fifth kind containing 15% by mass of phosphorus.

The lead-free solder balls to be soldered to the terminal pads for this test were those made of Sn—Ag—Cu alloy (comprising about 95.5% by mass of Sn, 4% by mass of Ag and 0.5% by mass of Cu), and having a diameter of 600 μm. The substrates and solder balls placed on the terminal pads were subjected to five cycles of one minute reflow heating up to a temperature of 260° C. The solder balls were molten and connected to the terminal pads, so as to form solder bumps having a round top as shown in FIG. 4B.

The solder bumps thus formed on the terminal pads were pulled apart from the terminal pads at a pulling speed of 500 μm/second, using a pulling test apparatus supplied from DAGE corporation/USA, which apparatus is adapted to catch hold of the terminal bumps and pull them off in a pulling direction normal to the terminal pad layer. Ten solder bumps including those formed closest to four corners of the rectangular wiring substrate for each sample were pulled apart, in other words, 200 solder bumps for each kind were pulled off.

Every remaining surface newly exposed after the respective solder bumps were pulled apart was inspected. There were two fracture modes caused by the pulling test; one was a boundary separation occurring at the interface between the nickel plating layer and the solder bump soldered thereon, and the other was a fracture of the dielectric layer of the wiring substrate. Notably, a dielectric layer fracture caused by the pulling test indicates that the bonding strength of the solder bump soldered on the terminal pad is very high so as to fracture the substrate, meaning that a very high bonding strength of the solder bump to the terminal pad is attained. In contrast, when boundary separation is observed, it means that improvement in bonding strength of the terminal pad to the solder bumps is still needed.

In the case of the first kind of samples (corresponding to a conventional wiring substrate), which contained about 6% by weight of phosphorus in the nickel plating layer of the terminal pad, 65.5% of the fracture modes were categorized as boundary separation and 35.5% of the fracture modes were categorized as dielectric layer fracture. In every tested sample, the fracture mode categorized as dielectric layer fracture did not exceed 45% of total fracture modes.

In the case of the second kind of samples of the invention that contained about 8.5% by weight of phosphorus in the nickel plating layer of the terminal pad, 17.9% of the fracture modes were categorized as boundary separation and 82.1% of the fracture modes were categorized as dielectric layer fracture. In the case of the third kind of samples of the invention that contained about 10% by weight of phosphorus in the nickel plating layer of the terminal pad, only 9.9% of the fracture modes were categorized as boundary separation and 90.1% of the fracture modes were categorized as dielectric layer fracture. In the case of the fourth kind of samples of the invention that contained about 13% by weight of phosphorus in the nickel plating layer of the terminal pad, 12.1% of the fracture modes were categorized as boundary separation and 87.9% of the fracture modes were categorized as dielectric layer fracture. In the case of the fifth kind of samples of the invention that contained about 15% by weight of phosphorus in the nickel plating layer of the terminal pad, 19.2% of the fracture modes were categorized as boundary separation and 81.8% of the fracture modes were categorized as dielectric layer fracture. In every tested sample according to the invention, the fracture mode categorized as dielectric layer facture exceeded 60% of total fracture modes.

By judging from the pulling test, it has been confirmed that the electroless-nickel plating layer constituting the nickel-plated terminal pad exhibits improved bonding strength with a lead-free solder ball containing mainly tin and that a reliable wiring substrate incorporating electroless-nickel plated terminal pads for soldering lead-solder bumps thereon is attained, when the electroless-nickel plating layer has a phosphorus content falling within the range of 8.5% to 15% by mass.

Figure 6:
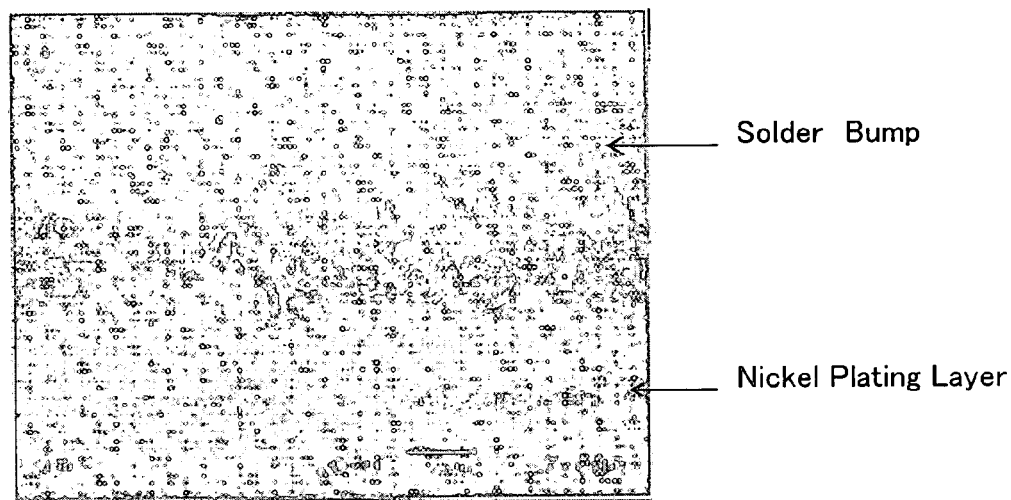
FIG. 6 is a SEM photo (magnification of 7,000 times) of a cross-section at the interface between a solder bump (upper portion of the photo) and an electroless-nickel plating layer (lower portion of the photo) of the terminal pad according to the invention, where the nickel plating layer contains phosphorus in an amount of 10% by mass.
Figure 7:
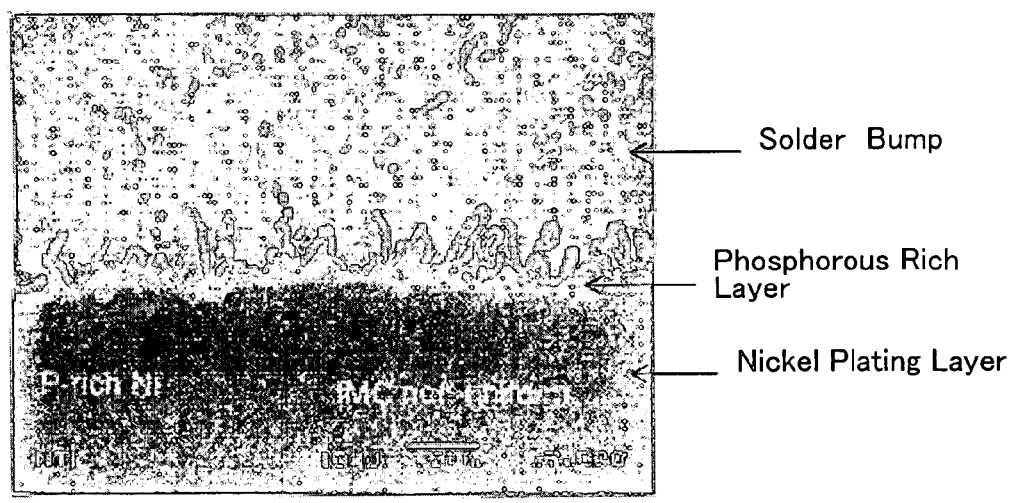
FIG. 7 is a cross-section as shown in FIG. 6, except that the nickel plating layer contains phosphorus in an amount of about 6% by mass according to a conventional process.

FIGS. 6 and 7 are SEM (scanning electron microscope) photos having a magnification of 7,000 times. These are cross-sections taken on a surface cut across the interface between the solder bump (upper portion of the photo) and electroless-nickel plating layer (lower portion of the photo) of the terminal pads. Particularly, FIG. 6 shows a cross-section in which the nickel plating layer contains phosphorus in an amount of about 10% by mass in accordance with the invention. FIG. 7 shows a corresponding cross-section for a conventional nickel plating layer containing phosphorus in an amount of about 6% by mass. As shown in FIG. 6, the brittle phosphorus-rich layer has disappeared from the interface according to the invention for a nickel plating layer containing phosphorus in an amount of about 10% by mass, whereas FIG. 7 shows that a phosphorus-rich layer is found at the interface according to conventional practice for a nickel plating layer containing phosphorus in an amount of about 6% by mass. Furthermore, FIGS. 6 and 7 show that a more uniform alloy comprising nickel and solder material tends to form at the interface according to the invention as compared to conventional practice.

While the invention has been described in detail and with reference to specific embodiments thereof, it will be apparent to one skilled in the art that various changes in modifications can be made therein without departing from the spirit and scope thereof.

This application is based on Japanese Patent Application No. 2004-63022 filed Mar. 5, 2004, incorporated herein by reference in its entirety.

What is claimed is:

1. A wiring substrate, comprising:
   a laminate of dielectric insulating layers and inner wiring conductors comprising a copper layer;
   via-conductors connecting the inner wiring conductors;
   nickel-plated terminal pads disposed on the wiring substrate and connecting to the inner wiring conductors;
   a gold plating layer formed on the nickel-plated terminal pads; and lead-free solder bumps formed on the nickel-plated terminal pads,
wherein the nickel-plated terminal pads comprise an electroless-nickel plating layer containing 8.5% to 15% by mass of phosphorus.

2. The wiring substrate as claimed in claim 1, wherein the gold plating layer is a displacement plating layer formed by displacing a surface portion of the electroless-nickel plating layer, and has a thickness of 0.03 to 0.1 μm.

3. The wiring substrate as claimed in claim 1, wherein the wiring substrate has a rectangular shape, and wherein when at least ten solder bumps are pulled apart at a pulling speed of 500 gm/second from the nickel-plated terminal pads including those formed closest to four corners of the wiring substrate, at least 50% of the pulled solder bumps result in fracture of a dielectric insulating layer.

4. The wiring substrate as claimed in claim 1, wherein the lead-free solder bumps comprise more than 90% by mass of tin and silver and/or copper.

5. A wiring substrate, comprising:
a laminate of dielectric insulating layers and inner wiring conductors comprising a copper layer;
via-conductors connecting the inner wiring conductors;
nickel-plated terminal pads disposed on the wiring substrate and connecting to the inner wiring conductors; and
lead-free solder bumps formed on the nickel-plated terminal pads;
wherein the nickel-plated terminal pads comprise an electroless-nickel plating layer containing 8.5% to 15% by mass of phosphorus.

6. The wiring substrate as claimed in claim 5, wherein the lead-free solder bumps comprise more than 90% by mass of tin and silver and/or copper.

7. The wiring substrate as claimed in claim 5, wherein the wiring substrate has a rectangular shape, and wherein when at least ten solder bumps are pulled apart at a pulling speed of 500 gm/second from the nickel-plated terminal pads including those formed closest to four corners of the wiring substrate, at least 50% of the pulled solder bumps result in fracture of a dielectric insulating layer.

8. A process for manufacturing a wiring substrate, said wiring substrate comprising:
a laminate of dielectric insulating layers and inner wiring conductors comprising a copper layer;
via-conductors connecting the inner wiring conductors;
nickel-plated terminal pads disposed on the wiring substrate and connecting to the inner wiring conductors;
a gold plating layer formed on the nickel-plated terminal pads; and
lead-free solder bumps formed on the nickel-plated terminal pads;
wherein the nickel-plated terminal pads comprise an electroless-nickel plating layer containing 8.5% to 15% by mass of phosphorus,
said process comprising:
forming a terminal pad comprising copper on a surface of a wiring substrate;
forming a nickel layer containing from 8.5 to 15% by weight of phosphorus on the terminal pad by electroless-nickel plating;
further forming a gold layer on the nickel layer by electroless-displacement plating in a thickness of 0.03 to 0.1 μm;
placing a lead free-solder ball containing tin on the gold layer; and
melting the lead free-solder ball at a temperature of higher than 200° C. so as to form a lead-free solder bump on the nickel plating layer constituting the terminal and to diffuse the gold layer into the solder bump.

9. The process for manufacturing a wiring substrate as claimed in claim 8, wherein the led-free solder bumps comprise more than 90% by mass of tin and silver and/or copper.

* * * * *